United States Patent
Zhang et al.

(10) Patent No.: US 11,876,523 B1
(45) Date of Patent: Jan. 16, 2024

(54) DPLL TIMING NORMALIZATION

(71) Applicant: XILINX, INC., San Jose, CA (US)

(72) Inventors: Hongtao Zhang, San Jose, CA (US); Ankur Jain, Sunnyvale, CA (US); Hsung Jai Im, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/079,649

(22) Filed: Dec. 12, 2022

(51) Int. Cl.
  *H03L 7/093* (2006.01)
  *H03L 7/081* (2006.01)
  *G04F 10/00* (2006.01)
  *H03M 1/08* (2006.01)
  *H03L 7/099* (2006.01)

(52) U.S. Cl.
  CPC ............ *H03L 7/093* (2013.01); *G04F 10/005* (2013.01); *H03L 7/081* (2013.01); *H03L 7/099* (2013.01); *H03M 1/0854* (2013.01)

(58) Field of Classification Search
  CPC ......... H03L 7/093; H03L 7/081; H03L 7/099; G04F 10/005; H03M 1/0854
  See application file for complete search history.

(56) References Cited

U.S. PATENT DOCUMENTS

| | | | | |
|---|---|---|---|---|
| 7,888,973 B1 * | 2/2011 | Rezzi | ...................... | H03L 7/087 327/105 |
| 8,508,266 B2 * | 8/2013 | Frantzeskakis | ........... | H03L 7/08 327/147 |
| 10,050,634 B1 * | 8/2018 | Zhao | ........................ | H03L 7/091 |
| 10,911,054 B2 * | 2/2021 | Yeo | ......................... | H03L 7/093 |
| 11,418,199 B1 * | 8/2022 | Cherniak | ................. | H03L 7/087 |
| 11,595,048 B1 * | 2/2023 | Harush | .................... | H03L 7/087 |
| 11,677,404 B1 * | 6/2023 | Harush | .................... | H03L 7/093 327/159 |
| 2008/0315959 A1 * | 12/2008 | Zhuang | ..................... | H03C 5/00 331/17 |
| 2009/0096539 A1 * | 4/2009 | Chang | ................... | H03L 7/0991 714/709 |
| 2016/0056827 A1 * | 2/2016 | Vlachogiannakis | .. | G04F 10/005 327/158 |
| 2017/0205772 A1 * | 7/2017 | Burg | ...................... | G04F 10/005 |
| 2021/0290146 A1 * | 9/2021 | Sorgenfrei | ............. | A61B 5/486 |
| 2022/0190833 A1 * | 6/2022 | Moslehi Bajestan | ........................ | H03L 7/1976 |

FOREIGN PATENT DOCUMENTS

| | | | |
|---|---|---|---|
| CN | 115580295 A | * | 1/2023 |
| JP | 2002529744 A | * | 9/2002 |
| JP | 2011517161 A | * | 5/2011 |

(Continued)

OTHER PUBLICATIONS

Zhuang, J., et al. "All-Digital RF Phase-Locked Loops Exploiting Phase Prediction," IPSJ Transactions on System LSI Design Methodology, vol. 7 2-15 (Feb. 2014).

*Primary Examiner* — Adam D Houston
(74) *Attorney, Agent, or Firm* — Patterson + Sheridan, LLP

(57) ABSTRACT

Embodiments herein describe normalizing an output of a TDC in a DPLL to a resolution of the TDC. A DTC can delay a reference clock which is then input into the TDC. The TDC outputs a digital code indicating a time difference between the delayed reference clock output by the DTC and a clock generated by a DCO in the DPLL. This digital code is normalized to a resolution of the TDC and the result is filtered by a DLF.

20 Claims, 6 Drawing Sheets

(56) References Cited

FOREIGN PATENT DOCUMENTS

| JP | 2021150844 A | * | 9/2021 | ........... | G01S 13/345 |
| JP | 2022053144 A | * | 4/2022 | ............ | G01S 17/26 |
| WO | WO-2010032184 A2 | * | 3/2010 | ........... | H03L 7/1976 |
| WO | WO-2019125300 A1 | * | 6/2019 | ............ | H03L 7/085 |
| WO | WO-2021213668 A1 | * | 10/2021 | ........... | G04F 10/005 |

* cited by examiner

US 11,876,523 B1

DPLL TIMING NORMALIZATION

TECHNICAL FIELD

Examples of the present disclosure generally relate to normalizing an output of a time-to-digital converter (TDC) in a digital phase locked loop (DPLL) to a resolution of the TDC.

BACKGROUND

ADPLL (All Digital PLL) is gaining popularity due to its smaller footprint and good scalability. The basic components include the TDC, a digital loop filter (DLF), and digital controlled oscillator (DCO). The TDC converts the time difference between an edge of a reference dock (clkref) and an edge of a feedback clock (clkv) into a digital signal or digital code. The DLF is a low pass filter which filters the digital code and forwards it to the DCO which outputs the feedback clock clkv.

The resolution of the TDC determines the amount of quantization noise added in the system during time-to-digital conversion. Finer resolution in picoseconds is needed for low jitter PLL design. On the other hand, when the frequency of the clock output by the DCO (Le., clkv) is not an integer multiplier of the reference clock frequency, the TDC needs to cover a time range up to at least a full cycle of the reference dock, which is in the order of nanoseconds. When the output clock of the DCO is not an integer multiple of the reference dock, this is referred to as a Fractional N (FracN) PLL. Moreover, a finer resolution limits the range TDC can resolve to a practical number of digital bits (typically 7~8). Thus, it is difficult for the TDC to have fine resolution but also have enough range to cover multiple cycles of the feedback clock clkv in the case of a FracN PLL. This complicates the design of the TDC as well as consumes substantially more power.

SUMMARY

Techniques for a digital phase locked loop (DPLL) are described. One example is a DPLL that includes a digital-to-time converter (DTC) configured to receive a reference dock and delay the reference clock based on a received first digital code, a time-to-digital converter (TDC) configured to output a second digital code indicating a time difference between the delayed reference clock output by the DTC and a clock generated by a digital controlled oscillator (DCO), circuitry configured to normalize the second digital code to a resolution of the TDC to generate a phase difference output, and a digital loop filter configured to receive the phase difference output.

Another embodiment described herein is an integrated circuit that includes a digital-to-time converter (DTC) configured to receive a reference clock and delay the reference dock based on a received first digital code, a time-to-digital converter (TDC) configured to output a second digital code indicating a time difference between the delayed reference dock output by the DTC and a dock generated by a digital controlled oscillator (DCO) via a feedback path, and combination circuitry configured to normalize the second digital code to a resolution of the TDC to generate a phase difference output where the clock generated by the DCO is based on the phase difference output.

Another embodiment described herein is a method of operating a DPLL. The method includes delaying a reference clock using a DTC, determining, using a TDC, a time difference between the delayed reference dock and a clock based on an output of a DCO, normalizing the time difference to a resolution of the TDC to generate a phase difference output, and filtering the phase difference output using a DLF.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures, It is contemplated that elements of one example may be beneficially incorporated in other examples.

DETAILED DESCRIPTION

Figure 1:
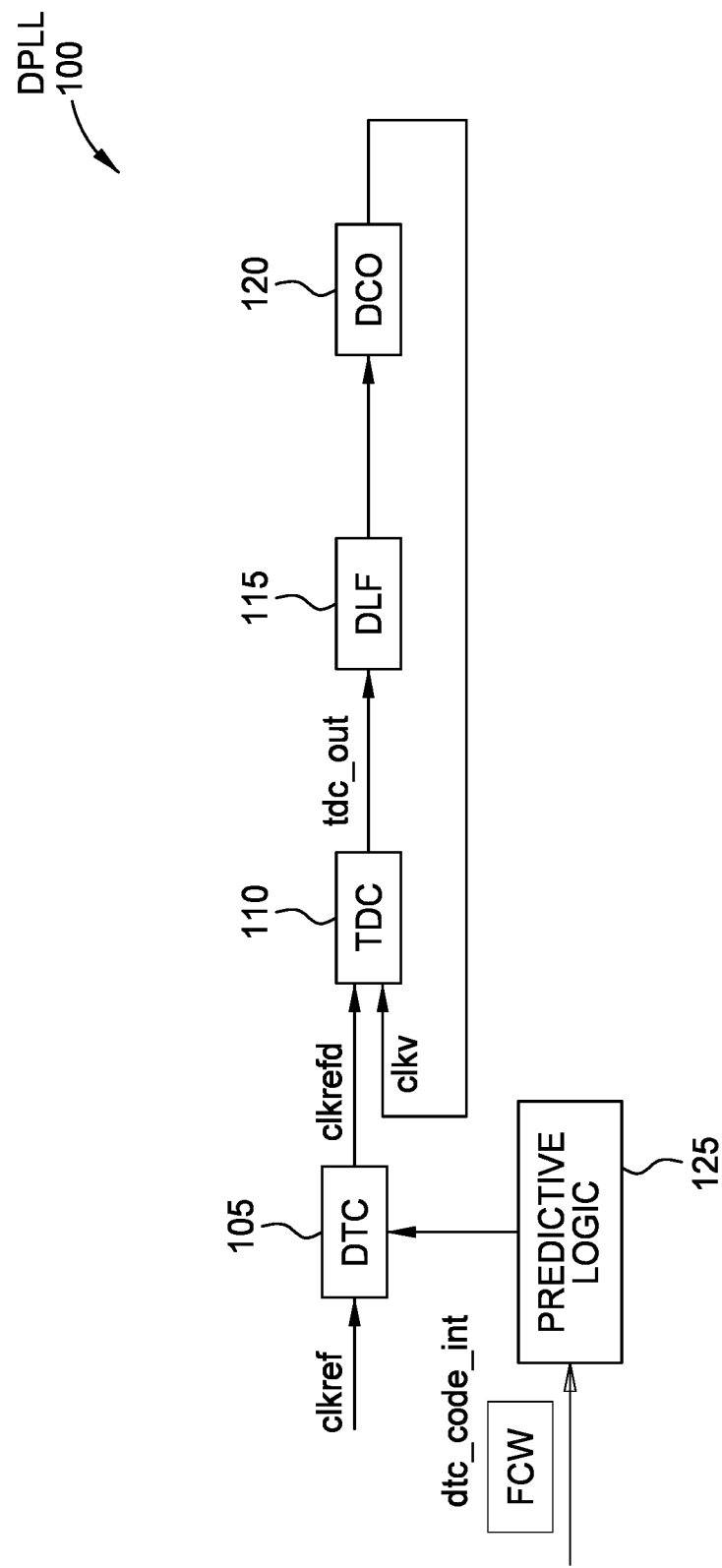
FIG. 1 is a block diagram of a DPLL, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe normalizing an output of a TDC in a DPLL to a resolution of the TDC. As discussed above, fragN PLL designs (e.g., where the reference clock and the clock generated by the DPLL are not integer multiples) add a lot of constraints on the design of the TDC. The embodiments herein describe using a DTC (Digital-to-Time Converter) to help reduce the time range a TDC has to cover by predictively delaying the edge of a reference clock close to the edge of the feedback clock such that the TDC only has to cover a much reduced range (e.g., on the order of a few DTC step sizes). This reduced range requirement makes it feasible to achieve a finer resolution of TDC design and hence a low jitter PLL. This design is discussed in FIG. 1.

Figure 2:
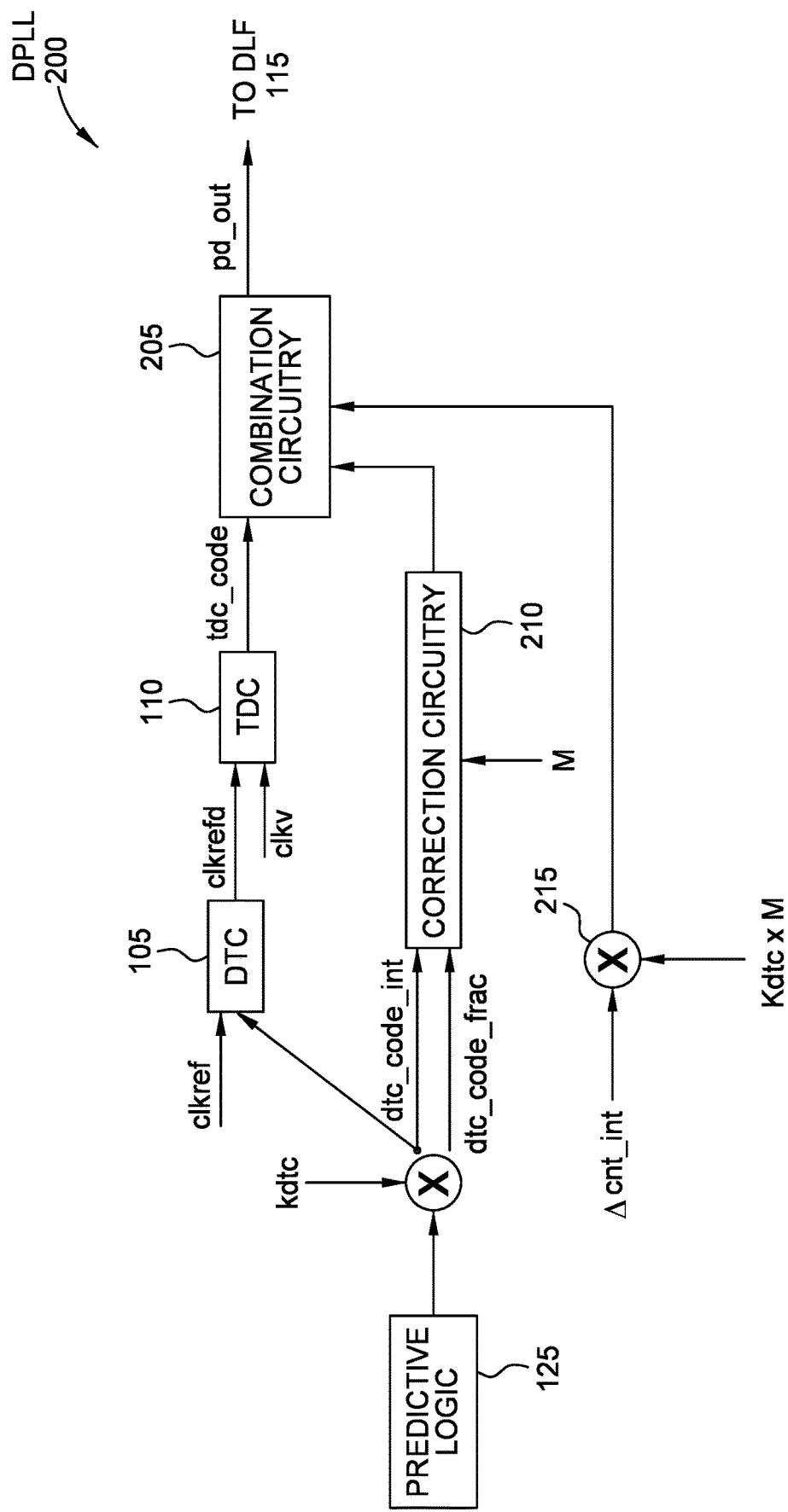
FIG. 2 is a block diagram of a DPLL where an output of a TDC is normalized to the resolution of the TDC, according to an example.
Figure 3:
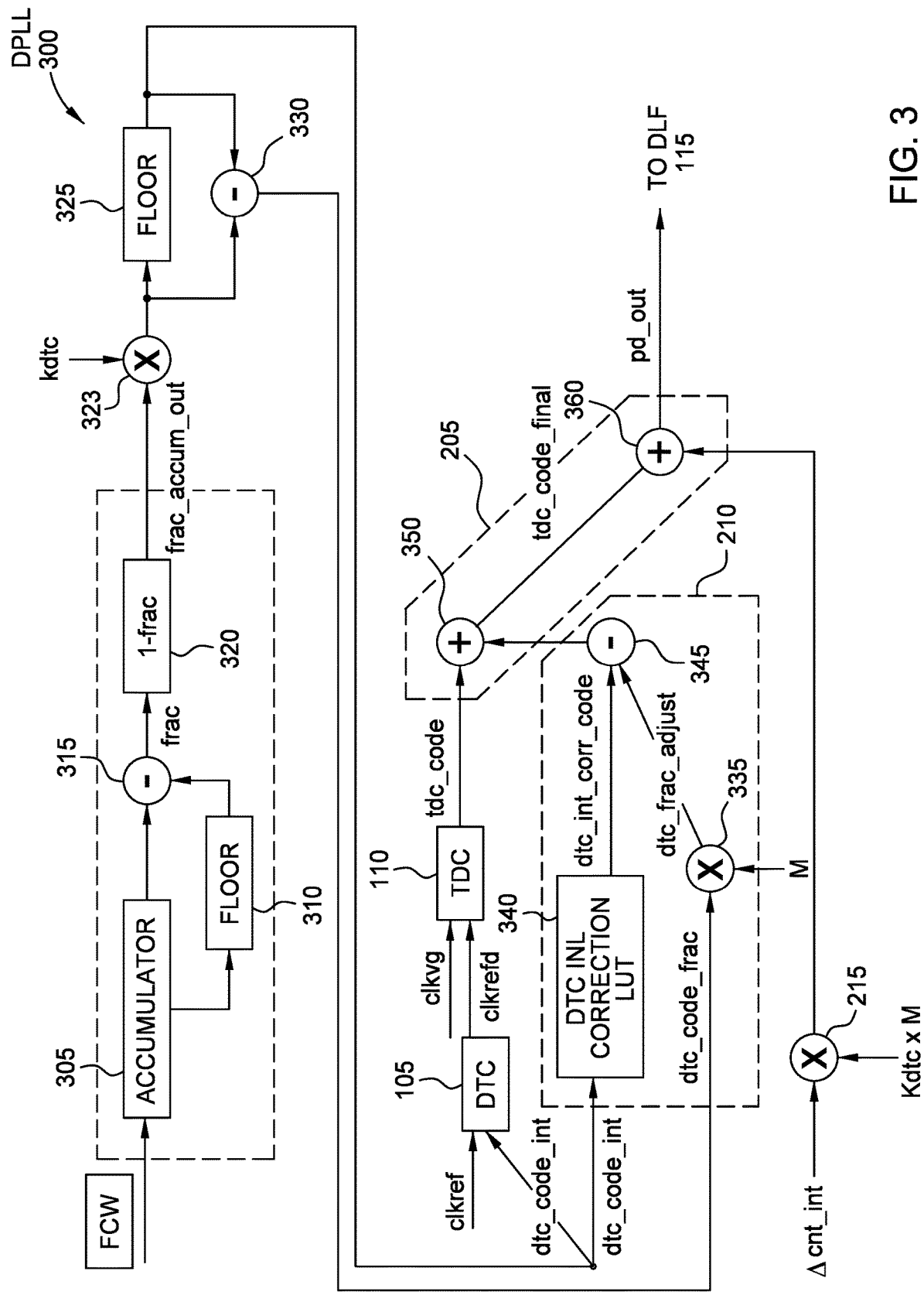
FIG. 3 is a circuit diagram of a DPLL where an output of a TDC is normalized to the resolution of the TDC, according to an example.
Figure 4:
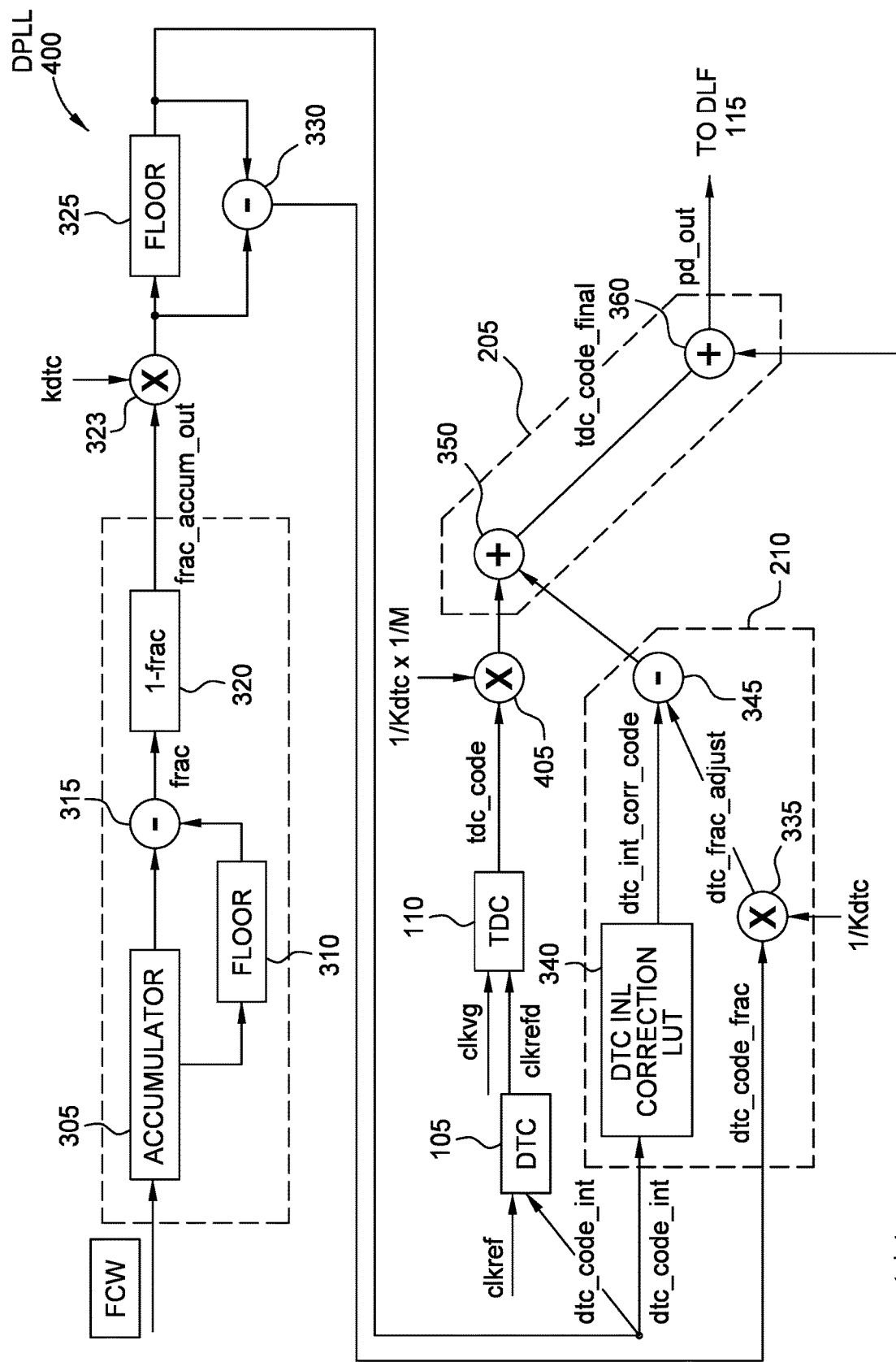
FIG. 4 is a circuit diagram of a DPLL where an output of a TDC is normalized to a period of the feedback clock, according to examples.

However, the exact DTC step size is usually unknown. In practice, a control code for the DTC can be determined by multiplying the expected delay with a scaling factor (Kdtc), which is adapted from an algorithm that minimizes the averaged mean error. One solution is to normalize the timing in the DPLL to the period of the clock generated by the DCO (i.e., the feedback clock). One example of this normalization is illustrated in FIG. 4. However, the normalization performed there relies on several division operations and multiplications that increase the power consumed by the DPLL. In contrast, FIGS. 2 and 3 illustrate an alternative solution where the timing in the DPLL is normalized to the resolution of the TDC which can eliminate the division operations and reduce the number of multiplications, thereby saving power in the DPLL relative to normalizing the timing of the system to the period of the feedback clock.

FIG. 1 is a block diagram of a DPLL 100, according to an example. The DPLL 100 includes a TDC 110, a DLF 115, and a DCO 120. In a basic DPLL, the TDC 110 determines a time difference (which can also be referred to as a phase difference) between a reference clock and the clock output by the DCO 120 (referred to as the feedback clock (clkv)). However, as discussed above, it is difficult for the TDC 110 to have fine resolution but also have enough range to cover multiple cycles of the feedback clock clkv in the case of a FracN PLL. As such, the DPLL 100 includes a DTC 105 which delays an edge of the reference clock (clkref) to output a delayed reference clock (clkrefd) to the TDC 110.

The DTC 105 reduces the time range a TDC 110 has to cover by predictively delaying the edge of a reference clock close to the edge of the feedback clock such that the TDC 110 only has to cover a reduced range (e.g., on the order of a few DTC step sizes). This reduced range makes it feasible to achieve a finer resolution of the TDC 110 and hence a low jitter DPLL 100.

In one embodiment, the DTC 105 periodically delays the clkref based on a predictive control logic 125 that uses a Frequency Control Word (FCW), which is the frequency ratio between clkv and clkref. That is, the DTC 105 receives a digital code (dtc_code_int) which it then uses to delay the clkref. The delayed reference clock (clkrefd) generated by the DTC 105 is closely phase aligned with clkv within a few DTC steps, thereby reducing the range that has to be covered by the TDC 110.

As shown, the predictive control logic 125 generates a DTC control code (i.e., dtc_code_int) that determines the amount of delay steps used by the DTC 105 to delay clkref. In one embodiment, dtc_code_int is calculated from the expected or predicted delay and the DTC step size. If the step size is known, the code is the ratio of the predicted delay over the step size. However, the exact DTC step size is usually unknown. Thus, in practice, the DTC control code can be determined by multiplying the expected delay with a scaling factor of the DTC (Kdtc), which is adapted from an algorithm that minimizes the averaged mean error.

FIGS. 2 and 3 illustrate one algorithm for compensating for the fact the DTC step size is unknown by normalizing the timing of a DPLL to the resolution of the TDC 110. This solution uses less complicated calculations than an alternative solution illustrated in FIG. 4 where the timing of a OPLL is normalized to a time period of the feedback clock clkv.

In either solution, in one embodiment, the normalization is performed on the output of the TDC 110. As shown, the TDC 110 generates a digital code (tdc_out) which indicates the timing or phase difference between clkrefd and clkv. After being normalized, this digital code is then filtered by the DLF 115 and then used by the DCO 120 to generate the clock signal of the DPLL 100. This clock signal can then be outputted to downstream circuitry (not shown) as well as being fed back to the TDC 110 as the feedback clock clkv.

In one embodiment, the DPLL designs discussed herein are divider-less DPLLs where the clock output by the DCO 120 is not divided down (i.e., the frequency is not reduced) when being fed back to the TDC 110. In any case, the frequency of the clkv is generally greater than the frequency of the reference clocks—i.e., clkref and clkrefd.

FIG. 2 is a block diagram of a DPLL 200 where an output of a TDC is normalized to the resolution of the TDC, according to an example. Like the DPLL 100 in FIG. 1, the DPLL 200 includes the DTC 105, the TDC 110, and the predictive logic 125. The DPLL 200 can also include the DLF 115 and the DCO 120 but for clarity these circuit components are not shown.

FIG. 2 illustrates normalizing the output of the TDC 110—i.e., the tdc_code—using the combination circuitry 205. The output of the TDC 110 is a phase difference (pd_out) that has been normalized to the output of the TDC 110. To normalize the phase difference output, the combination circuitry 205 receives inputs from a correction circuitry 210 and a multiplier 215.

In one embodiment, the correction circuitry 210 corrects for non-linearity in dtc_code_int which is the digital code that controls the DTC 105 and corrects for quantization errors in the dtc_code_int using the dtc_code_frac signal. The correction circuitry 210 will be discussed in more detail in FIG. 3. In sum, the correction circuitry 210 provides an output to the combination circuitry 205 which corrects for non-linearity in the digital code that controls the DTC 105 and the quantization errors.

The multiplier 215 receives a count integer (Δcnt_int) which is a count of the number of cycle differences between clkv and clkref and a gain of the DTC (Kdtc) which is scaled by M which is an integer ratio between the resolution of the DTC 105 (dtc_res) and the resolution of the TDC 110 (tdc_res). That is, M can be expressed as:

$$M = \frac{dtc\_res}{tdc\_res} \qquad (1)$$

Because Δcnt_int is based on the period of the clkv (Tclkv), but the DPLL 200 wants to normalize the tdc_code to the resolution of TDC—i.e., tdc_res—Δcnt_int is scaled by Tclkv/tdc_res. Using Equation 1, this can be expressed as:

$$\frac{Tclkv}{tdc\_res} = \frac{Tclkv}{dtc\_res}M \qquad (2)$$

Given that the gain of the DTC 105 (Kdtc) can be expressed as:

$$Kdtc = \frac{Tclkv}{dtc\_res} \qquad (3)$$

Equation 2 can instead be expressed as:

$$Kdtc \times M \qquad (4)$$

Thus, the output of Equation 4 is the scaling factor that can be input into the multiplier 215 in order to scale Δcnt_int by Tclkv/tdc_res.

Also, in this embodiment, dtc_code_frac is scaled from dtc_res to tdc_res using the relationship in Equation 1. This scaling can be performed by providing the scaling factor of M to the correction circuitry 210.

In this manner, the outputs of the correction circuitry 210 and the multiplier 215 can be provided to the combination circuitry 205 to normalize the tdc_code to the resolution of TDC 110.

FIG. 3 is a circuit diagram of a DPLL 300 where an output of the TDC 110 is normalized to the resolution of the TDC, according to an example. That is, FIG. 3 illustrates examples of implementing the predictive logic 125, the correction circuitry 210, and combination circuitry 205 in FIG. 2. The remaining portions of the DPLL 300 are the same as the DPLL 200 in FIG. 2.

The predictive control logic 125 in FIG. 3 includes an accumulator 305 that receives the FCW which is based on the ratio between clkref and clkv. FCW is fed to the accumulator 305 since it is not an integer number. One output of the accumulator 305 is provided to a floor circuit 310 which truncates the fractional bits and determines the integer portion of the number. The subtractor 315 receives the output of the accumulator 305 and the integer bits from the floor circuit 310. In a hardware implementation, the output of the accumulator 305 is represented as N×m. The floor circuit 310 takes the N MSB (Most Significant Bits, integer portion). The subtraction of N from N·m is equivalent to taking the m LSB (Least Significant Bit, fractional portion). The result of the subtractor 315 is a fractional signal (frac) which is fed into a 1-frac circuit 320 which generates an accumulated fractional output (frac_accum_put). That is, the circuit 320 subtracts the frac signal generated the subtractor 315 from 1.

The signal frac_accum_out is multiplied by the gain of the DTC (i.e., Kdtc), and this result, is fed to the floor circuit 325, which performs quantization. The product of Kdtc and frac_accum_out determines the delay the DTC 105 needs to apply. The delay is quantized—i.e., is not continuous in an implementation where the signals are all digitized in a digital PLL. The floor circuit 325 determines the integer portion of the calculated product. The output of the floor circuit 325 is the dtc_code_int for controlling the DTC 105. In addition, the input and output of the floor circuit 325 is subtracted by a subtractor 330 to generate a fractional portion of the digital code that is used to correct for the quantization error that occurs due to the generation of DTC code. That is, in one embodiment, the DTC 105 is controlled by an integer digital code—i.e., dtc_code_int—but this ignores that there also can exist a fraction portion which represents the quantization error of converting the FCW into an integer digital code dtc_code_int.

While the quantization error could be ignored, this makes the DPLL 300 less accurate. Instead, the fractional portion of the digital code—i.e., dtc_code_frac—is received at a multiplier 335 and scaled with M. As discussed above in FIG. 2, scaling the fractional portion dtc_code_frac with M, scales (or converts) this signal from the resolution of the DTC 105 to the resolution of the TDC 110. In one embodiment, M is a constant number. However, M can fluctuate due to process, voltage, and temperature (PVT) changes. In another embodiment, an adaption technique can be used to adjust M based on PVT changes. In any case, the output of the multiplier 335 is an adjusted fractional portion (dtc_frac_adjust).

Also mentioned above, the digital code dtc_code_int can be non-linear. Thus, in addition to providing dtc_code_int to the DTC 105, dtc_code_int is fed to a DTC Integral Non-Linearity (INL) correction look-up table (LUT) 340 which corrects to the non-linearity. The INL represents the error between an ideal delay and the actual delay with the increasing delay codes. The delay units are cascaded and hence the non-ideal delay from each delay unit accumulates as the delay ode increases. This is why INL is considered as opposed to DNL (Differential Nonlinearity), which is the difference between the ideal delay and the actual delay for each delay unit. For example, for a delay code (dtc_code_int) of 5, the accumulated or integrated nonlinearity of the first 5 delay units determines the nonlinearity correction that is applied to fix the INL.

The output of the LUT 340 is then subtracted from dtc_frac_adjust by a subtractor 345 to result in a correction value for correcting the tdc_code output by the TDC 110 which represents the time difference between the delayed reference clock clkrefd and a gate feedback clock clkvg received from the DCO.

In this embodiment, the combination circuitry 205 includes an adder 350 which combines tdc_code_correction with tdc_code to generate tdc_code_final. This value is then combined by an adder 360 with the output of the multiplier 215 to result in the phase difference pd_out, which can then be provided to the DLF 115 (not shown). In this manner, the tdc_code generated by the TDC 110 is normalized to the resolution of the TDC 110.

The gain of DTC—i.e.; Kdtc—can be calculated using Equation 3. However, Kdtc may also be affected by PVT changes. Thus, in one embodiment an adaptation loop can adjust the value of Kdtc using frac_accum_out and pd_out.

FIG. 4 is a circuit diagram of a DPLL 400 where an output of the TDC 110 is normalized to a period of the feedback clock, according to examples. That is, instead of normalizing the output to the resolution of the TDC 110 like in FIGS. 2 and 3, the DPLL 400 normalizes the output to the period of the feedback clock Tclkv.

The same reference numbers are used in FIG. 4 as used in FIG. 3 to indicate circuitry that remains the same. Namely, the circuitry in the prediction control logic 125, the correction circuitry 210, and the combination circuitry 205 did not change. Further, the DPLL 400 also includes the DTC 105 and the TDC 110.

Relative to the circuitry of the DPLL 300 in FIG. 3, the DPLL 400 includes an additional multiplier 405 which multiplies the tdc code to a scaling factor 1/iKdtc×1/M to normalize it to Tcklv. On the other hand, the DPLL 400 does not include the multiplier 215 in FIG. 3 since the count Δcnt_int is already based on Tclkv.

In addition to these circuit changes, the input of the multiplier 335 in the correction circuitry 210 has changed in DPLL 400 relative to DPLL 300. Specifically, instead of receiving M, the multiplier 335 receives 1/Kdtc.

As shown in FIG. 4, the DPLL 400 relies on the multiplication factors of Kdtc, 1/Kdtc and (1/Kdtc×1/M). 1/Kdtc is equivalent to division of Kdtc. As such, the computation cost is high to perform these divisional operations. In contrast, FIG. 3 has no divisional operations. This can greatly reduce implementation costs as multiplication is less costly than division. Further, FIG. 3 also has fewer multiplication operations than FIG. 4.

Figure 5:
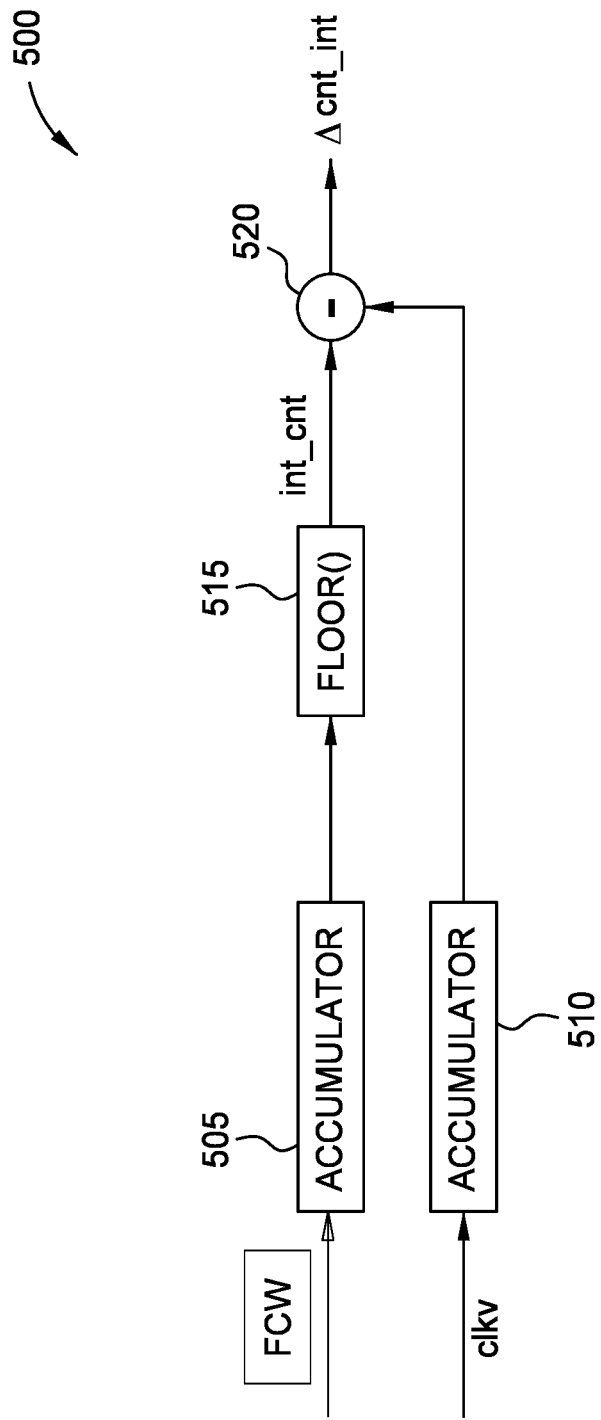
FIG. 5 is a circuit diagram for counting the cycle difference between the reference clock and feedback clock, according to examples.

FIG. 5 is a circuit 500 for counting the cycle difference between the reference clock and feedback clock, according to examples. The circuit 500 can be used in any of the DPLLs discussed above in FIGS. 2-5 to calculate the count Δcnt_int.

As shown, a first accumulator 505 receives the FCW which is based on the ratio between clkref and cikv. FCW is fed to the accumulator 505 since it is not an integer number. One output of the accumulator 505 is provided to a floor circuit 515 which outputs an integer count (int_cnt) to a subtractor 520. The quatized/integer number output by the floor circuit 515 represents the frequency.

In parallel, a second accumulator 510 receives the reference clock clkv. The output of the second accumulator 510 is then subtracted from the int_cnt by a subtractor 520 to generate Δcnt_int. Like the output of the floor circuit 515, the output of the accumulator 510 output is also an integer. The difference of the two integers represents the frequency difference between clkv (actual) and the desired clock.

The circuitry discussed above in FIGS. 1-5 can be disposed on an integrated circuit. For example, the DPLL can be implemented in an integrated circuit (e.g., an application specific integrated circuit (ASIC)).

Figure 6:
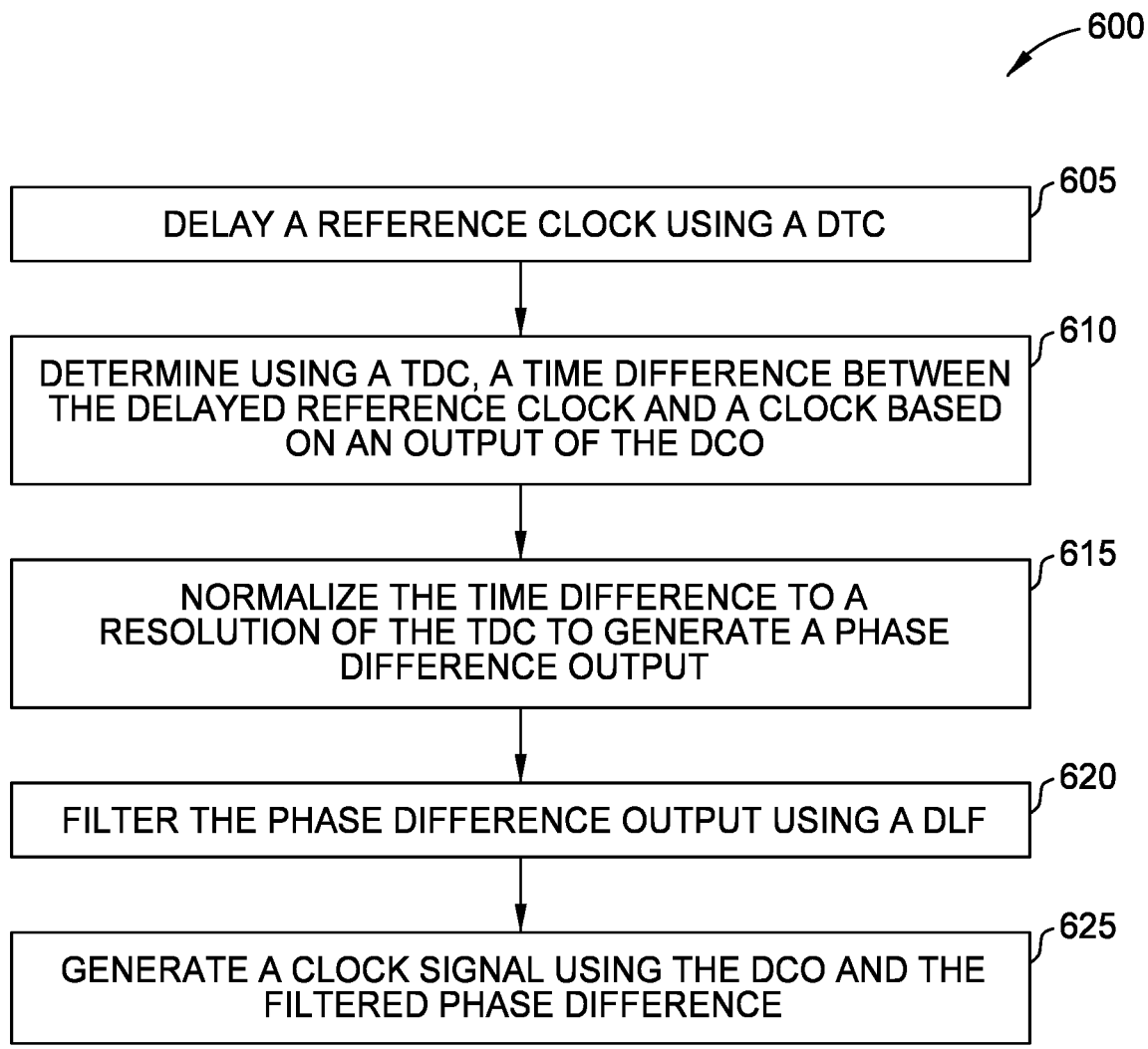
FIG. 6 is a flowchart for normalizing the output of the TDS to the resolution of the TDC, according to an example.

FIG. 6 is a flowchart of a method 600 for normalizing the output of the TDS to the resolution of the TDC, according to an example. At block 605, a DTC delays a reference dock before it is received at a TDC in a DPLL. In one embodiment, the DPLL also includes predictive control logic (e.g., logic 125 in FIG. 1) which receives a FCW as an input and outputs fractional accumulation signal frac_accum_out. This may be scaled by the gain of the DTC (Kdtc) and used to generate a digital code for the DTC.

At block 610, the TDC determines a time difference between the delayed reference clock and a dock based on an output of the DCO. In one embodiment, the delayed reference dock generated by the DTC is compared to a feedback dock received from the DCO. In one embodiment, the DPLL is a divider-less implementation where the clock output by the DCO is not divided when being fed back using a feedback path to input of the TDC at block 610.

At block 615, the DPLL normalizes the time difference to a resolution of the TDC to generate a phase difference output. Examples of this normalization are shown in FIGS. 2 and 3. In addition to normalizing the time difference generated by the TDC, the DPLL can also correct for non-linearity in the digital code that controls the DTC at block 605 and correct for quantization errors in the digital code using the dtc_code_frac signal illustrated in FIGS. 2 and 3.

At block 620, the DLF filters the phase difference output.

At block 625, the DCO generates a clock signal using the filtered phase difference received from the DLF. In addition to providing this clock signal to downstream circuitry, as discussed at block 615. the clock (or some variant of the clock) can be fed back and used as an input to the TDC.

In the preceding, reference is made to embodiments presented in this disclosure However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved, It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A digital phase locked loop (DPLL), comprising:
    a digital-to-time converter (DTC) configured to receive a reference clock and delay the reference clock based on a received first digital code;
    a time-to-digital converter (TDC) configured to output a second digital code indicating a time difference between the delayed reference clock output by the DTC and a clock generated by a digital controlled oscillator (DCO);
    circuitry configured to normalize the second digital code to a resolution of the TDC to generate a phase difference output;
    a digital loop filter configured to receive the phase difference output; and
    correction circuitry configured to correct for quantization errors in the first digital code based on receiving a fractional portion of the first digital code, the correction circuitry including a multiplier configured to scale the fractional portion of the first digital code by a ratio of a resolution of the DTC.

2. The DPLL of claim 1, wherein the circuitry is configured to receive a count of a number of cycle differences between the reference clock and the clock generated by the DCO, wherein the count is scaled by a gain of the DTC.

3. The DPLL of claim 2, wherein the count is also scaled by a ratio of a resolution of the DTC and the resolution of the TDC.

4. The DPLL of claim 3, wherein the circuitry is configured to add the count to a signal based on the second digital code as part of generating the phase difference output.

5. The DPLL of claim 1, wherein an output of the correction circuitry is added to the second digital code as part of generating the phase difference output.

6. The DPLL of claim 5, wherein the multiplier is configured to also scale the fractional portion of the first digital code by a ratio of the resolution of the TDC.

7. The DPLL of claim 6, wherein the correction circuitry is configured to correct a non-linearity in the first digital code.

8. The DPLL of claim 7, wherein the correction circuitry comprises a correction look-up table that receives the first digital code and generates a first output for correcting the non-linearity in the first digital code.

9. The DPLL of claim 8, wherein the scaled fractional portion is subtracted with the first output to generate a correction value that is combined with the second digital code.

10. The DPLL of claim 1, wherein normalizing the second digital code to the resolution of the TDC is performed without any performing any divisional operations.

11. An integrated circuit, comprising:
    a digital-to-time converter (DTC) configured to receive a reference clock and delay the reference clock based on a received first digital code;
    a time-to-digital converter (TDC) configured to output a second digital code indicating a time difference between the delayed reference clock output by the DTC and a clock generated by a digital controlled oscillator (DCO) via a feedback path;
    combination circuitry configured to normalize the second digital code to a resolution of the TDC to generate a phase difference output; and
    correction circuitry configured to correct for quantization errors in the first digital code based on receiving a fractional portion of the first digital code, the correction circuitry including a multiplier configured to scale the fractional portion of the first digital code by a ratio of a resolution of the DTC,
    wherein the clock generated by the DCO is based on the phase difference output.

12. The integrated circuit of claim 11, wherein the combination circuitry is configured to receive a count of a number of cycle differences between the reference clock and the clock generated by the DCO, wherein the count is scaled by a gain of the DTC.

13. The integrated circuit of claim 12, wherein the count is also scaled by a ratio of a resolution of the DTC and the resolution of the TDC.

14. The integrated circuit of claim 13, wherein the combination circuitry is configured to add the count to a signal based on the second digital code as part of generating the phase difference output.

15. The integrated circuit of claim 11, wherein an output of the correction circuitry is added to the second digital code as part of generating the phase difference output.

16. The integrated circuit of claim 15, wherein the multiplier is configured to also scale the fractional portion of the first digital code by a ratio of the resolution of the TDC.

17. The integrated circuit of claim 16, wherein the correction circuitry is configured to correct a non-linearity in the first digital code.

18. The integrated circuit of claim 17, wherein the correction circuitry comprises a correction look-up table that receives the first digital code and generates a first output for correcting the non-linearity in the first digital code.

19. The integrated circuit of claim 18, wherein the scaled fractional portion is subtracted with the first output to generate a correction value that is combined with the second digital code.

20. A method of operating a DPLL, the method comprising:
    delaying a reference clock using a DTC based on a received first digital code;
    determining, using a TDC, a time difference between the delayed reference clock and a clock based on an output of a DCO;
    normalizing the time difference to a resolution of the TDC to generate a phase difference output;
    filtering the phase difference output using a DLF; and
    correcting, by correction circuitry, quantization errors in the first digital code based on receiving a fractional portion of the first digital code, the correction circuitry including a multiplier configured to scale the fractional portion of the first digital code by a ratio of a resolution of the DTC.

* * * * *